(12) United States Patent
Bae et al.

(10) Patent No.: US 7,750,831 B2
(45) Date of Patent: Jul. 6, 2010

(54) PHASE DETECTOR UTILIZING ANALOG-TO-DIGITAL CONVERTER COMPONENTS

(75) Inventors: Heyon Min Bae, Champaign, IL (US); Naresh Ramnath Shanbhag, Champaign, IL (US); Andrew C. Singer, Champaign, IL (US); Jonathan B. Ashbrook, Homer, IL (US)

(73) Assignee: Finisar Corporation, Sunnyvale, CA (US)

( * ) Notice: Subject to any disclaimer, the term of this patent is extended or adjusted under 35 U.S.C. 154(b) by 222 days.

(21) Appl. No.: 12/039,424

(22) Filed: Feb. 28, 2008

(65) Prior Publication Data

US 2009/0219008 A1    Sep. 3, 2009

(51) Int. Cl.
*H03M 1/00*    (2006.01)
(52) U.S. Cl. .................... 341/126; 341/155
(58) Field of Classification Search .......... 341/126, 341/155, 156, 159, 120
See application file for complete search history.

(56) References Cited

U.S. PATENT DOCUMENTS 6,784,821 B1 * 8/2004 Lee ............................ 341/155
7,333,364 B2 * 2/2008 Yu et al. ................. 365/185.09

* cited by examiner

*Primary Examiner*—Rexford N Barnie
*Assistant Examiner*—Joseph Lauture
(74) *Attorney, Agent, or Firm*—Workman Nydegger

(57) ABSTRACT

Methods and systems are provided for an improved phase detector utilizing analog-to-digital converter (ADC) components. In an embodiment, the method includes from an ADC having a sampling clock signal that determines sampling instants, obtaining a first comparison value between an analog signal and a first threshold voltage at a first sampling instant, and obtaining a second comparison value between the analog signal and a second threshold voltage at a second sampling instant. The method further includes, from a supplemental circuit, obtaining a third comparison value between the analog signal and a third threshold voltage at a third sampling instant between the first and second sampling instants. The method further includes processing the first, second, and third comparison values to determine a phase relationship between the analog signal and the sampling clock.

23 Claims, 11 Drawing Sheets

CLOCK ADVANCED IN PHASE

CLOCK DELAYED IN PHASE

CLOCK ADVANCED IN PHASE

CLOCK DELAYED IN PHASE

CLOCK ADVANCED IN PHASE

CLOCK DELAYED IN PHASE

PHASE DETECTOR UTILIZING ANALOG-TO-DIGITAL CONVERTER COMPONENTS

FIELD OF THE INVENTION

The present invention generally relates to performing phase detection, and more specifically relates to performing phase detection using analog-to-digital converter components.

BACKGROUND

A typical phase detector is shown in FIG. 1A. This phase detector is sometimes referred to as an Alexander phase detector, or a Bang-Bang phase detector. An analog signal received on line 102 is sampled by the flip-flop 106 on the rising edge of the clock signal on line 104. The analog signal is again sampled on the falling edge of the clock by the flip-flop 108. On the next rising edge of the clock signal, the analog signal is again sampled by flip-flop 106, while the previous samples are shifted into flip-flops 110 and 112. Thus, the data samples held in flip-flops 110, 112, 106 correspond to samples A, B, and C, respectively, as shown in FIG. 1B. If the outputs of flip-flop 106 and 110 are both the same (A=C), then the outputs of exclusive OR (XOR) gates 116, 120, are both equal to zero and no phase update occurs. On the other hand, the presence of either a falling edge (from high to low) or a rising edge (from low to high) in the data signal will result in different values for A and C (A≠C), and a phase update may be validated.

FIG. 2A shows an analog-to-digital converter (ADC) 200. As shown, the ADC 200 is a flash ADC. According to FIG. 2A, the ADC 200 includes voltage comparators $206_1$ to $206_2{}^N{}_{-1}$, with analog signal 202 and threshold voltages $204_1$ to $204_2{}^N{}_{-1}$, respectively, as inputs to the voltage comparators $206_1$ to $206_2{}^N{}_{-1}$. The outputs of each of the comparators $206_1$ to $206_2{}^N{}_{-1}$ are a digital word typically referred to as a thermometer code, and it may be present on a bus, buffer or register depicted as 208.

Each comparator 206 produces a "1" when the analog signal 202 is greater than its particular threshold voltage. Otherwise, the comparator output is "0". Thus, if the analog input 202 is between threshold voltage $204_2$ and $204_3$, for example, voltage comparators $206_3$ to $206_2{}^N{}_{-1}$ produce "1"s and the remaining comparators (comparators $206_1$ and $206_2$) produce "0"s.

The thermometer code 208 shows the range of "1"s and "0"s in a plurality of bit slots. The point where the code changes from "1"s to "0"s is the point where the analog signal 202 becomes smaller than the threshold voltage for the respective comparator. The thermometer code 208 is referred to as such because of its similarity to a mercury thermometer, where a mercury column (i.e., "1"s) always rises to the appropriate temperature and no mercury (i.e., "0"s) is present above that temperature. The output of the thermometer code 208 is connected to decoder 212 via bus 210, and the output 214 of the decoder 212 is typically an N-bit digital code.

In some applications, the ADC may include a series of one or more buffers connected to each comparator. As shown in FIG. 2B, buffers $207_1$ to $207_M$ are connected in series to comparator $206_4$, and each of the buffers $207_1$ to $207_M$ are connected to clock 216 via lines $216_1$ to $216_M$. The buffers $207_1$ to $207_M$ cooperatively store and shift comparison values generated by the comparator $206_4$.

SUMMARY

Methods and systems are provided for an improved phase detector utilizing ADC components. The inventors have recognized that some prior art ADC devices include components that may be utilized, along with some additional or supplemental componentry, to form a phase comparator.

In accordance with a method, the method includes, from an ADC having a sampling clock signal that determines sampling instants, obtaining a first comparison value indicative of a comparison between an analog input signal and a first threshold voltage at a first sampling instant, and obtaining a second comparison value indicative of a comparison between the analog input signal and a second threshold voltage at a second sampling instant. The method further includes, from a supplemental circuit, obtaining a third comparison value indicative of a comparison between the analog input signal and a third threshold voltage at a third sampling instant between the first and second sampling instants. The method further includes processing the first, second, and third comparison values to determine a phase relationship between the analog signal and the sampling clock.

In one embodiment, the first and third threshold voltages are equal to each other. In another embodiment, the second and third threshold voltages are equal to each other. In another embodiment, the first and second threshold voltages are equal to each other. In another embodiment, the first, second, and third threshold voltages are equal to one another. In yet another embodiment, the first, second, and third threshold voltages are different from each other.

In some embodiments, the ADC includes a plurality of comparators that each compares an analog signal to a respective threshold voltage. In other embodiments, the method includes obtaining the first and second comparison values from comparison values generated by one of the comparators of the plurality of comparators. In yet other embodiments, the ADC includes a plurality of buffers, and the method includes obtaining the first and second comparison values from first and second buffers of the plurality of buffers.

In an embodiment, the respective threshold voltages corresponding to the plurality of comparators cooperatively define a voltage range, and the first, second, and third threshold voltages are each approximately at a middle voltage in the voltage range.

In one embodiment, processing the first, second, and third comparison values includes providing the first, second, and third comparison values to first and second XOR gates. In another embodiment, processing the first, second, and third comparison values includes verifying that the first and second comparison values indicate a voltage transition. In yet another embodiment, processing the first, second, and third comparison values includes determining whether the third sampling instant is before or after a transition point, the transition point being the time at which the analog signal crosses the third threshold voltage. In still yet another embodiment, the method further includes advancing the sampling clock when the third sampling instant is after the transition point, and retarding the sampling clock when the third sampling instant is before the transition point. Preferably, the third sampling instant is at a midpoint between the first and second sampling instants.

In accordance with a system, the system includes an ADC having (i) a sampling clock to determine sampling instants, and (ii) a plurality of comparators. A given comparator in the plurality of comparators preferably generates a first plurality of comparison values by comparing the analog signal to a first threshold voltage. The system further includes a second buffer connected to the given comparator. The second buffer stores a second comparison value generated by the given comparator at a second sampling instant. The system further includes a first buffer connected to the second buffer. The first buffer stores a first comparison value generated by the given comparator at a first sampling instant.

The system further includes (i) a supplemental comparator that generates a second plurality of comparison values by comparing the analog signal to a second threshold voltage, and (ii) a supplemental buffer connected to the supplemental comparator. In other embodiments, the system further includes a supplemental sample clock coupled to the supplemental buffer. Preferably the supplemental buffer stores a third comparison value generated by the supplemental comparator at a third sampling instant between the first and second sampling instants. Additionally, the system includes phase detection logic that processes the first, second, and third comparison values to determine a phase relationship between the analog signal and sampling clock.

In an embodiment, the ADC is a flash ADC that generates a thermometer code having a plurality of bit slots, and the first comparison value is a first bit from a given bit slot at the first sampling instant, and the second comparison value is a second bit from the given bit slot at the second sampling instant. In some embodiments, the ADC includes at least one of the first and second buffers.

In an embodiment, each of the plurality of comparators compares the analog signal to a respective threshold voltage. In some embodiments, the respective threshold voltages corresponding to the plurality of comparators cooperatively define a voltage range, and the first and second threshold voltages are each approximately at a middle amplitude in the voltage range.

In one embodiment, the phase detection logic comprises first and second XOR gates. In another embodiment, the phase detection logic verifies that the first and second comparison values indicate a voltage transition, and determines whether the third sampling instant is before or after a transition point. In other embodiments, the system further includes phase-correction circuitry to advance the sampling clock when the third sampling instant is after the transition point, and retard the sampling clock when the third sampling instant is before the transition point.

These as well as other aspects, advantages, and alternatives will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Certain examples are described below in conjunction with the appended drawing figures, wherein like reference numerals refer to like elements in the various figures, and wherein.

DETAILED DESCRIPTION

Methods and systems are provided for an improved phase detector utilizing ADC components. By providing an improved phase detector that utilizes ADC components, the improved phase detector may utilize already existing ADC components on the circuit board. Hence, the improved phase detector may be cheaper to produce, and occupy less circuit-board space than a typical phase detector, for instance.

Figure 3:
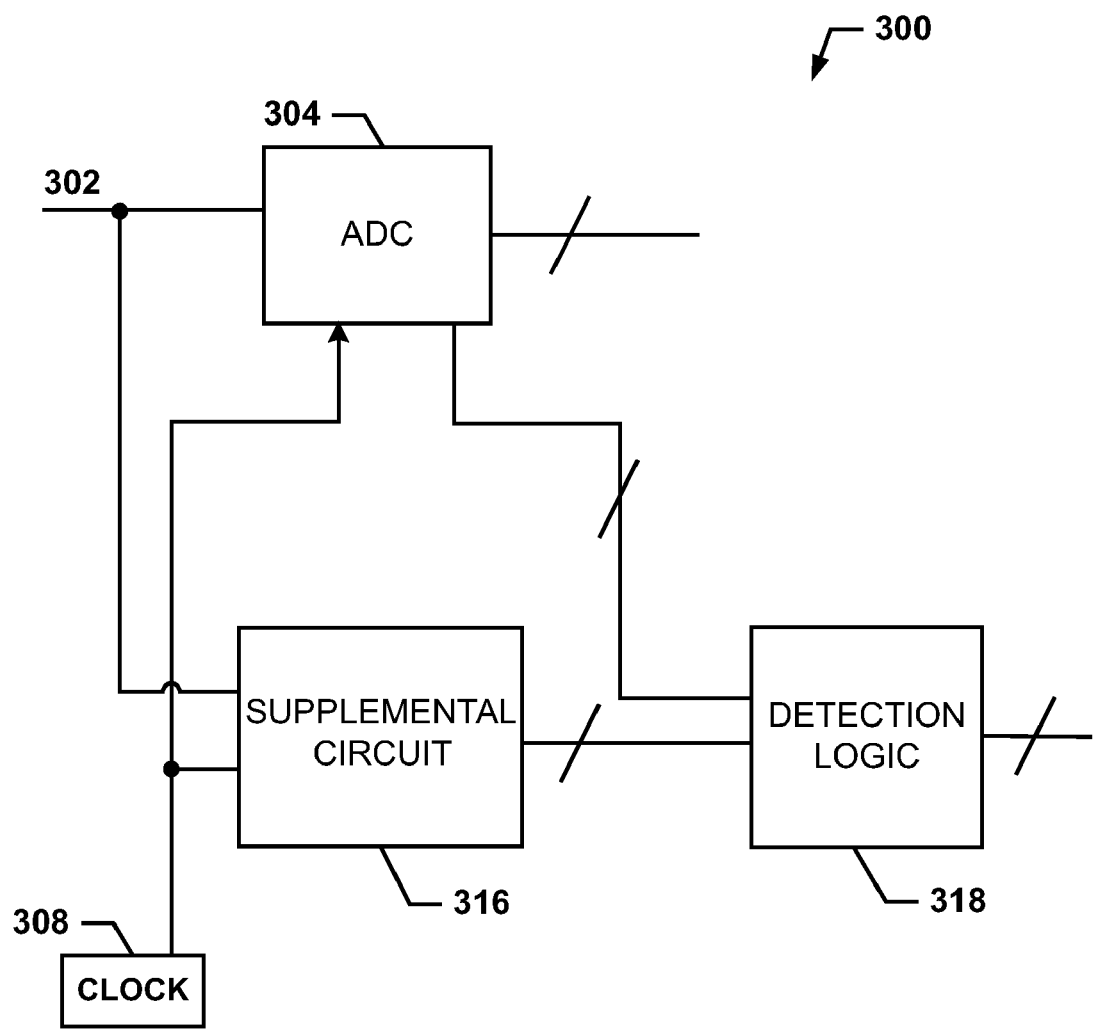
FIG. 3 is a block diagram of an improved phase detector utilizing ADC components, according to an example.

FIG. 3 is a block diagram of an improved phase detector 300 that utilizes ADC components, according to an example. As shown in FIG. 3, the improved phase detector 300 includes ADC 304 (which may be a flash ADC), supplemental circuit 316, and phase detection logic 318.

Figure 1A:
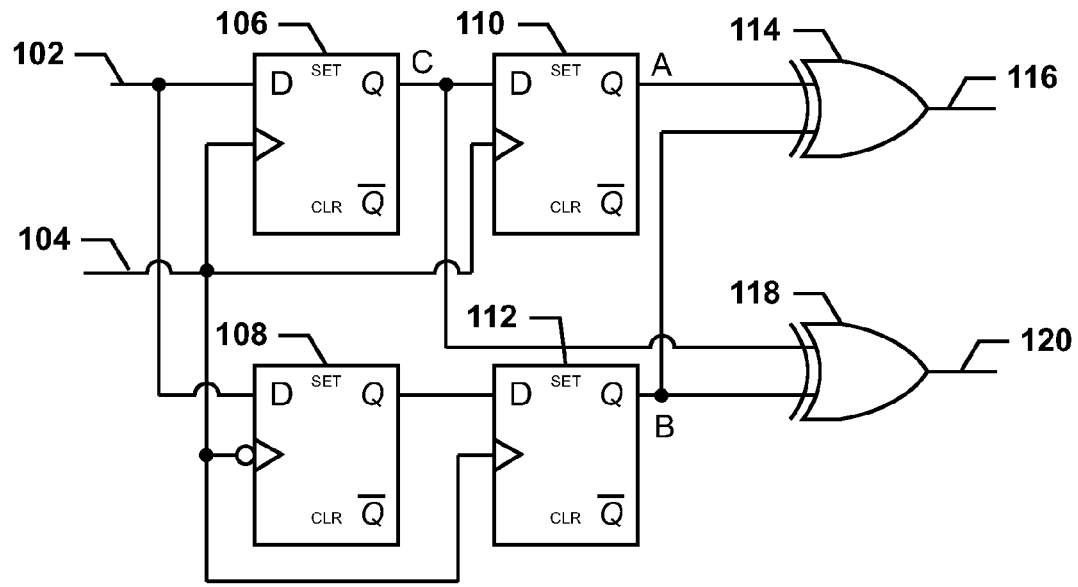
FIG. 1A is a block diagram depicting a prior art phase detector.
Figure 1B:
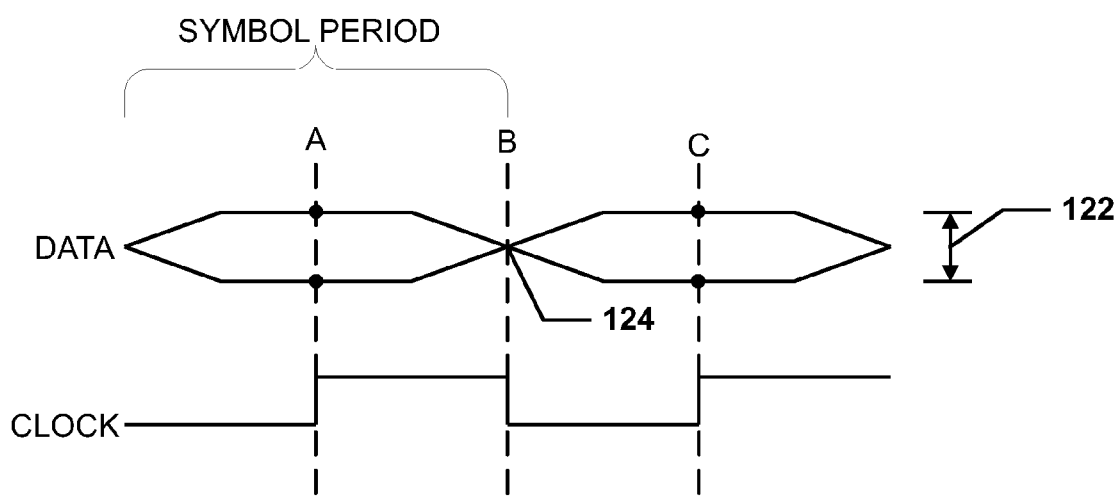
FIG. 1B is timing diagram depicting the operation of the prior art phase detector of FIG. 1A.
Figure 2A:
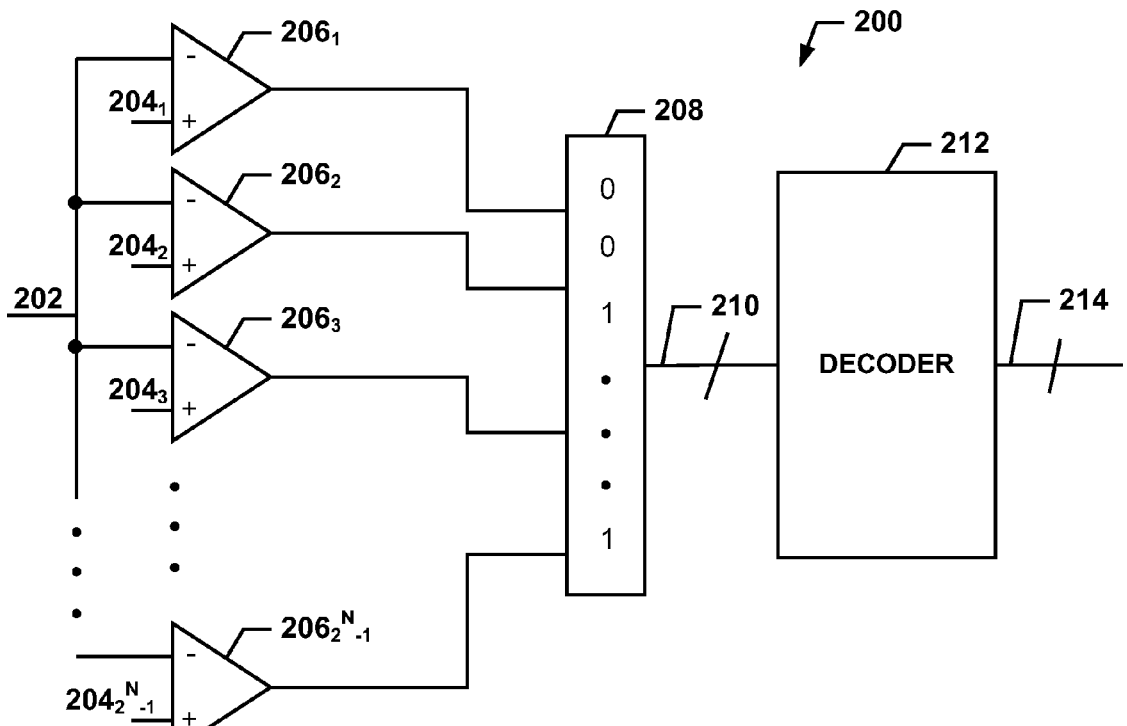
FIG. 2A is a block diagram of a prior art ADC.
Figure 2B:
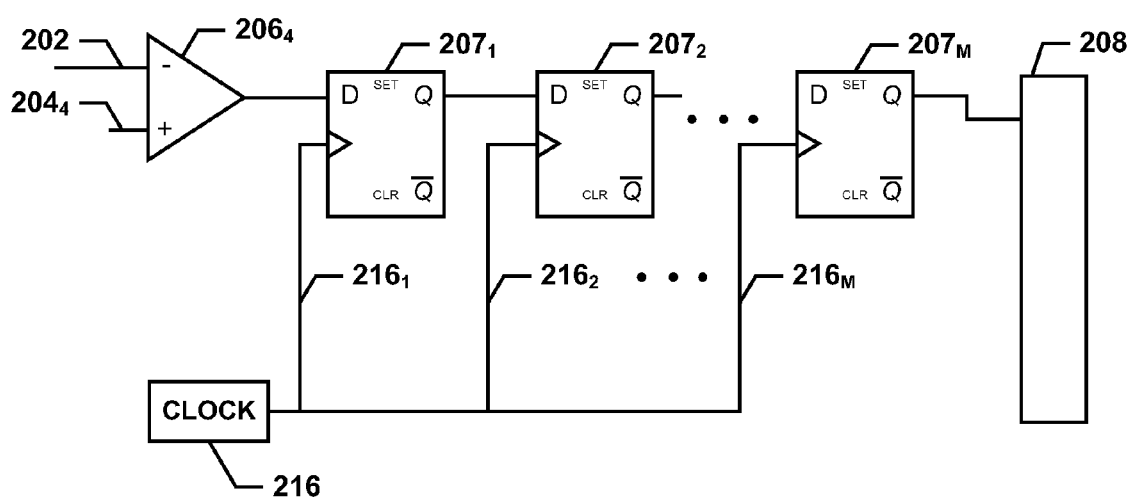
FIG. 2B is a block diagram of a portion of the prior art ADC of FIG. 2A.

The ADC 304 receives as inputs analog signal 302 and a clock signal from a clock 308. The analog signal 302 may originate from any of a variety of sources, such as a fiber optical communications link. Typical of most analog signals, the analog signal 302 will include voltage transitions from a high amplitude to a low amplitude, and vice versa (e.g., voltage transition 122 in FIG. 1B). The analog signal 302 will also include "a transition point," which is the time at which the analog signal 302 crosses an approximately middle amplitude between a high and low amplitude (e.g., transition point 124 in FIG. 1B).

The clock 308 (also known as a sampling clock) determines sampling instants. In particular, the clock 308 determines a sampling rate (i.e. the rate at which sampling instants occur) for the buffers within the ADC 304 and, in this embodiment, supplemental circuit 316. Preferably, the sampling rate of the clock 308 is twice the rate of the analog signal 206. Such a sampling rate allows the clock 308 to sample the analog signal 302 before and after a voltage transition (e.g., change from high to low or low to high), and also during the transition as well. Further, the clock 308 may produce any of a variety of signals (e.g., square waves). Although only a single clock is depicted, the improved phase detector 300 may utilize multiple clocks as well. Of course, other examples exist for the clock 308.

The ADC 304 also includes a plurality of comparators $310_1$ to $310_{2^N-1}$ (not shown). The comparators $310_1$ to $310_{2^N-1}$ receive as inputs threshold voltages $306_1$ to $306_{2^N-1}$ (not shown), respectively. The threshold voltages $306_1$ to $306_{2^N-1}$ may originate from a single voltage source that is divided by a series of resistors, or may originate from multiple voltage sources. Further, the threshold voltages $306_1$ to $306_{2^N-1}$ may cooperatively define a voltage range. Of course, other examples exist for the threshold voltages $306_1$ to $306_{2^N-1}$, and other examples exist for their respective source(s).

Figure 4A:
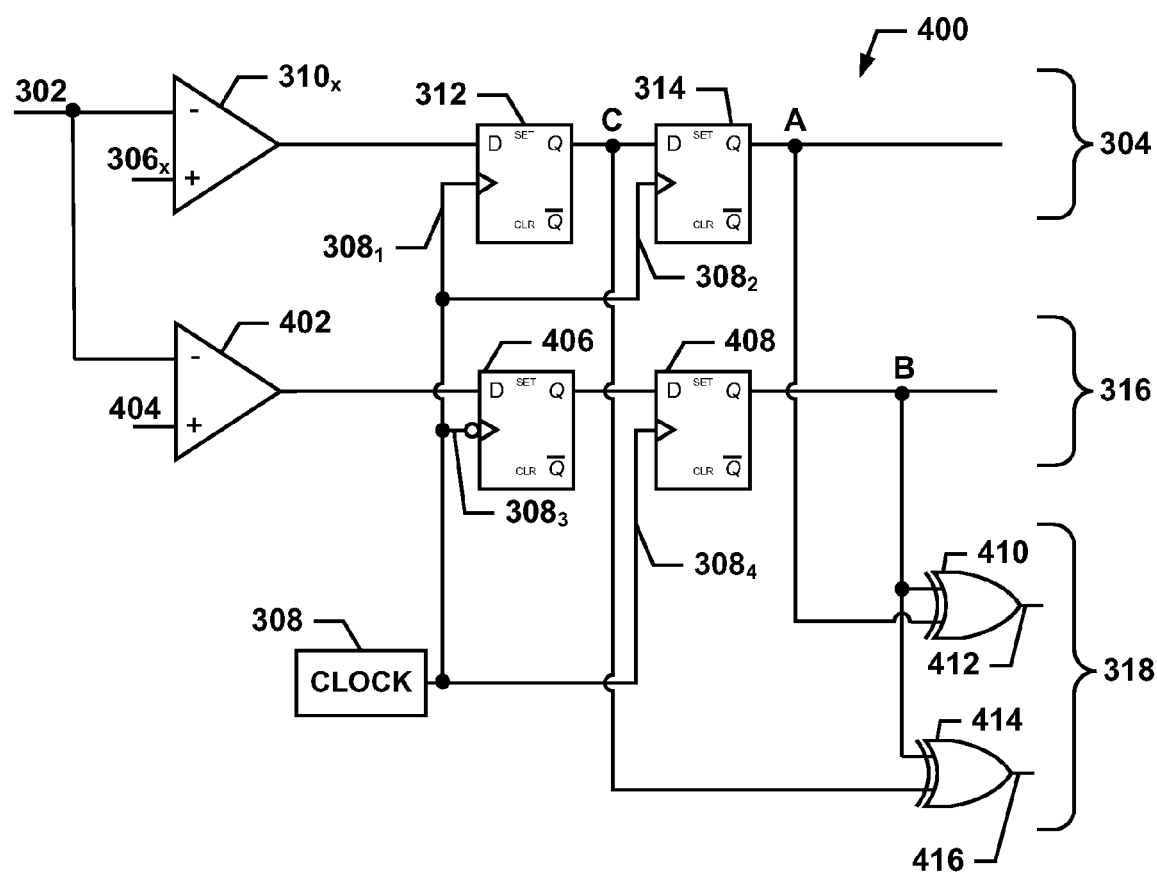
FIG. 4A is a circuit diagram of an embodiment of an improved phase detector utilizing ADC components, according to an example.

As depicted in FIG. 4A, the comparator $310_X$ generates comparison values (e.g., "0"s and/or "1"s) by comparing the analog signal 302 to the threshold voltage $306_X$. The threshold voltage $306_X$ may approximately be at a middle amplitude in the voltage range defined by the threshold voltages $306_1$ to $306_{2^N-1}$. Put another way, the threshold voltage $306_X$ may approximately be a middle amplitude corresponding to a transition point 124 in the analog signal 302. Of course, other examples exist for the threshold voltage $306_X$.

The ADC 304 may include a plurality of buffers as well. For example, as shown in FIG. 4A, the ADC 304 includes buffers 312 and 314. The buffer 312 is connected to the output of the comparator $310_X$, and receives as an input a clock signal $308_1$ from the clock 308. The buffer 314 is connected to the output of the buffer 312, and receives as an input a clock signal $308_2$ from the clock 308. The buffers of 312 and 314 (or buffers of the ADC 304, more generally) may be D flip-flops having a logic threshold that cause input voltages above the threshold to be latched as a logic one and input voltages below the threshold to be latched as a logic zero. Other types of flip-flops may be used (e.g., master-slave D flip flops and edge-triggered flip flops), JK flip flops, SR flip flops, and/or T flip flops. In addition, in some embodiments, the comparators and buffers may be combined such that each of the buffers may have a logic threshold that causes input voltages above the threshold to be latched as a logic one and input voltages below the threshold to be latched as a logic zero. The logic threshold may be adjusted to provide the desired quantization characteristics. In operation, at a sampling instant (i.e. a first sampling instant) determined by the clock 308, the buffer 312 stores a comparison value (i.e., first comparison value) generated by the comparator $310_X$ at approximately that sampling instant. At the next sampling instant (i.e., second sampling instant) determined by the clock 308, the buffer 312 stores another comparison value (i.e., second comparison value) generated by the comparator $310_X$ at approximately that sampling instant, while the first comparison value previously stored in the buffer 312 (that was generated in the first sampling instant) is shifted to and stored in the buffer 314.

In the case where the ADC 304 is a flash ADC, the flash ADC generates a thermometer code having a plurality of bit slots, and the first comparison value is a first bit from a given bit slot at the first sampling instant, and the second comparison value is a second bit from the given bit slot (or perhaps another bit slot) at the second sampling instant.

The improved phase detector 300 further includes supplemental circuit 316, which receives as inputs analog signal 302 and a clock signal from the clock 308 (of course, the supplemental circuit 316 may receive a clock signal from another clock). As shown in FIG. 4A, the supplemental circuit 316 includes comparator 402, and buffers 406 and 408. The comparator 402 generates a plurality of comparison values by comparing the analog signal 302 to the threshold voltage 404.

Figure 4B:
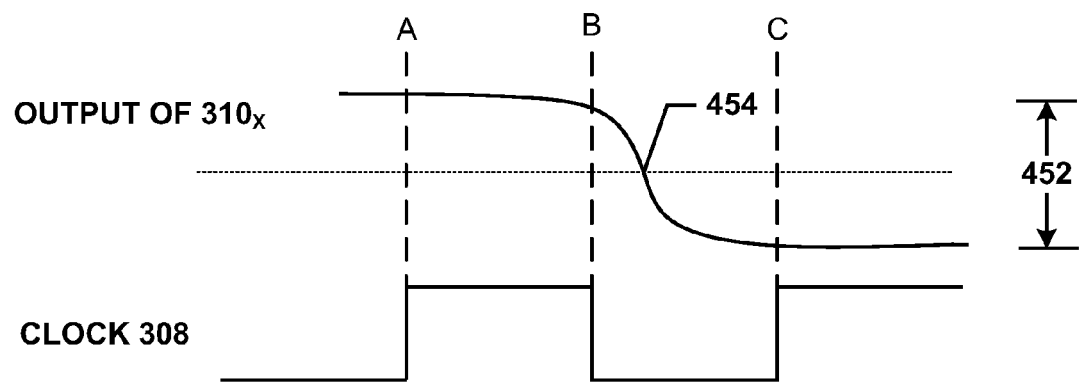
FIG. 4B is a timing diagram depicting the operation of the improved phase detector of FIG. 4A when the clock is advanced in phase, according to an example.
Figure 4C:
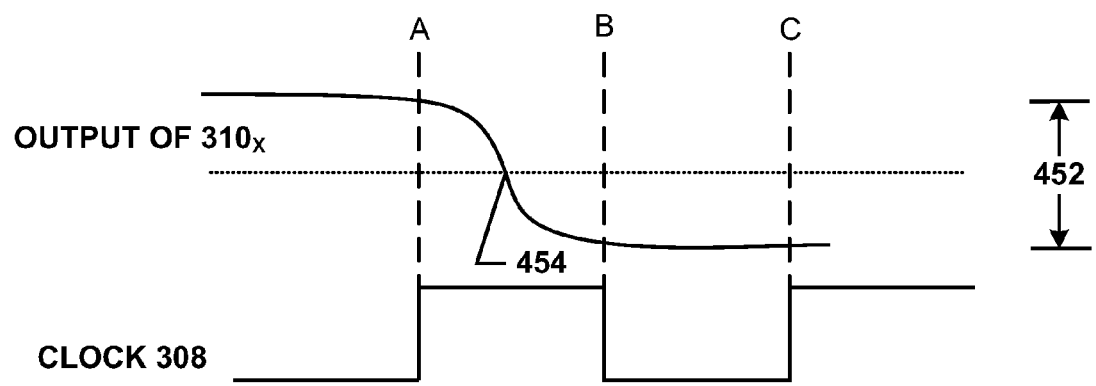
FIG. 4C is a timing diagram depicting the operation of the improved phase detector of FIG. 4A when the clock is delayed in phase, according to an example.

The threshold voltage 404 may take any of a variety of values. For instance, the threshold voltage 404 may approximately be a middle amplitude corresponding to a transition point (e.g., transition point 454 as shown in FIGS. 4B and 4C, where the transition point is the time at which the analog signal crosses the threshold voltage 404) in the analog signal 302. As other examples, the threshold voltage 404 may be equal to the threshold voltage $306_X$, or may differ (e.g., comparators having different threshold voltages may be combined to provide a multi-bit output).

As noted, the buffer 406 triggered by a falling edge of the clock is connected to the output of the comparator 402, and receives as an input a clock signal from the clock 308. The buffer 408 is connected to the output of the buffer 406, and receives as an input a clock signal from the clock 308. As shown in FIG. 4A, the output of the comparator 402 is sampled by the buffer 406 at a falling edge of the clock 308. The resulting sample is then shifted to and stored in the buffer 408 at the next rising edge of the clock 308. In operation, at an intermediate sampling instant (third sampling instant) between the first and second sampling instants, the buffer 406 stores a comparison value (e.g., third comparison value) generated by the comparator 402 at approximately that intermediate sampling instant. Preferably, the third sampling instant is at a midpoint between the first and second sampling instants. Further, at the second sampling instant (the second rising edge of the clock 308), the third comparison value is shifted from the buffer 406 and stored in the buffer 408 while the first comparison value is shifted from the buffer 312 and stored in the buffer 314.

By way of example, FIG. 4B is a timing diagram depicting the operation of the improved phase detector 300 when the clock 308 is advanced in phase with respect to the signal transition and FIG. 4C is a timing diagram depicting the operation of the improved phase detector 300 when the clock 308 is delayed in phase with respect to the signal transition. As shown in FIGS. 4B and 4C, at the first rising edge of the clock 308 (i.e. first sampling instant), the buffer 312 stores the first comparison value generated by the comparator $310_X$ (i.e. the output of the buffer 312 is latched at point A). At the next rising edge of the clock 308 (i.e., second sampling instant), the first comparison value A is shifted to and stored in the buffer 314, while the second comparison value C generated by the comparator $310_X$ is stored by the buffer 312. Hence, the first and second comparison values separated by one symbol period are stored in buffers 314 and 312, respectively, and these values correspond to samples A and C, respectively, as shown in FIG. 4B. As further shown in FIG. 4B, on the falling edge of the clock 308 (i.e. third sampling instant), the buffer 406 stores the third comparison value generated by the comparator 402. On the next rising edge of the clock 308 (i.e., second sampling instant), the third comparison value is shifted to and stored in the buffer 408, and this value corresponds to sample B as shown in FIG. 4B. Thus, in one full clock cycle of the clock 308, the first, second, and third comparison values generated at the first, second, and third sampling instants, respectively, are stored at outputs A, C, and B as depicted in FIG. 4A, respectively.

The improved phase detector 300 further includes the phase detection logic 318. As shown in FIG. 4A, the phase detection logic 318 includes XOR gates 410 and 414. The output A of buffer 314 and output B of buffer 408 are connected to the inputs of the XOR gate 410, and the output C of buffer 312 and output B of buffer 408 are connected to the inputs of the XOR gate 414. The XOR gates 410 and 414 include outputs 412 and 416, respectively. Of course, other examples exist for the phase detection logic 318.

Generally, the phase detection logic 318 processes the first, second, and third comparison values to determine a phase relationship between the analog signal and clock 308 (e.g., such as whether the sampling rate of the clock 308 is faster or slower than twice the rate of the analog signal 302). More specifically, the phase detection logic 318 may verify whether the first and second comparison values indicate a voltage transition (e.g., voltage transition 452 as shown in FIGS. 4B and 4C) in the analog signal 302 (i.e., whether a voltage transition in the analog signal 302 occurs between the first and second sampling instants). To illustrate, if the outputs of buffers 312 and 314 are both the same (A=C), then the outputs of the XOR gates 410 and 414 are both equal to zero, thus indicating a voltage transition in the analog signal 302 has not occurred between the first and second sampling instants. On the other hand, the presence of either a falling edge (from high to low) or a rising edge (from low to high) between the first and second sampling instants in the analog signal 302 will result in different values for A and C (A≠C), and the outputs 412 and 416 of XOR gates 410 and 414, respectively, will be different, thus indicating a voltage transition has occurred between the first and second sampling instants.

When a voltage transition in the analog signal 302 occurs between the first and second sampling instants, a transition point exists between the two sampling instants. In the case where a transition point exists, the phase detection logic 318 may determine whether the third sampling instant is before or after the transition point. If the third sampling instant is before the transition point, then the clock 308 is too fast, and needs to be slightly retarded. On the other hand, if the third sampling instant is after the transition point, then the clock 308 is too slow, and needs to be slightly advanced.

According to an example depicted in FIG. 4B, if A and C are not the same and if A=B, the third sampling instant is before the transition point, thus indicating that the clock 308 is too fast (e.g., the falling edge of the clock occurs during the same bit time as sample A). In the case where the clock 308 is too fast, the output 412 of XOR gate 410 is low and the output 416 of XOR gate 414 is high. On the other hand, if B=C as the example depicted in FIG. 4C, then the third sampling instant is after the transition point, thus indicating that the clock 308 is too slow (e.g., the falling edge of the clock occurs during the same bit time as sample C), then the logic outputs at 412 and 416 are reversed. Thus, the outputs 412 and 416 of XOR gates 410 and 414, respectively, may cooperatively provide an indication as to whether the sampling rate of the clock 308 is faster or slower than twice the rate of the analog signal 206.

Figure 5A:
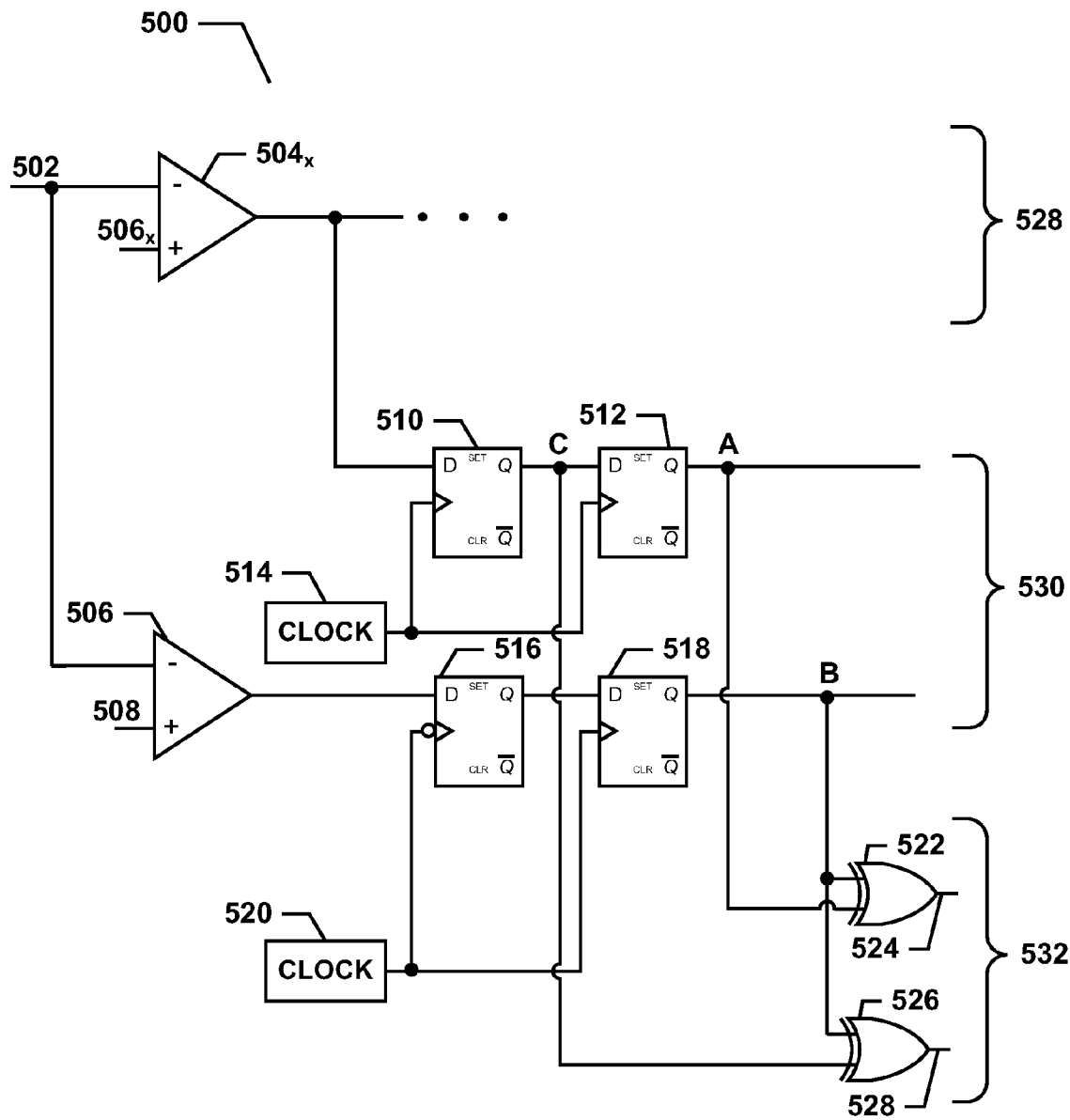
FIG. 5A is a circuit diagram of another embodiment of an improved phase detector utilizing ADC components, according to an example.

FIG. 5A is a circuit diagram of another embodiment of an improved phase detector 500 utilizing ADC components, according to an example. The improved phase detector 500 includes ADC 528, supplemental circuit 530, and phase detection logic 532. The improved phase detector 500 may operate substantially similar to the improved phase detector 300.

For example, similar to that above, the ADC 528 includes the comparator $504_X$. The comparator $504_X$ receives as inputs the analog signal 502 and a threshold voltage $506_X$. However, in this embodiment, the improved phase detector 500 does not utilize buffers from the ADC 528. Rather, the buffers are provided by the supplemental circuit 530.

The supplemental circuit 530 may include comparator 506, which receives as inputs the analog signal 502 and a threshold voltage 508. The supplemental circuit 530 may further include buffers 510 and 512, which receive as inputs clock signals from the clock 514 which may be part of either the ADC 528 or supplemental circuit 530. The buffer 510 is connected to the output of the comparator $504_X$, and the buffer 512 is connected to the output of the buffer 510. Also as shown, the supplemental circuit 530 may further include buffers 516 and 518, which receive as inputs clock signals from the clock 520 which may be part of either the ADC 528 or supplemental circuit 530. The buffer 516 is connected to the output of the comparator 506, and the buffer 518 is connected to the output of the buffer 516. Of course, the supplemental circuit 530 may take other arrangements as well. For example, the supplemental circuit 530 may not include the comparator 506, and the output of the ADC comparator $504_X$ may be connected to each of the buffers 510 and 516.

In this embodiment, rather than a single clock timing each of the buffers of the improved phase detector circuit 500, clocks 514 and 520 are provided. Preferably, the clock signals provided by the clock 514 and the clock signals are at the same rate and in phase with one another. According to an example, the clocks 514 and 520 and the buffers 510, 512, 516, and 518 cooperatively produce first, second, and third samples, with the third sampling instant being between the first and second sampling instants. Preferably the third sampling instant is substantially at a midpoint between the first and second sampling instants. Of course, other examples exist for the clock signals provided by the clocks 514 and 520, and for the number of clocks utilized by the improved phase detector 500.

Similar to the improved phase detector 300, the improved phase detector 500 includes phase detection logic 532. The phase detection logic 532 operates substantially similar to the phase detection logic 318. As shown, the phase detection logic 532 includes XOR gates 522 and 526. The output A of buffer 512 and output B of buffer 518 are connected to XOR gate 522, and the output C of buffer 510 and output B of buffer 518 are connected to the XOR gate 526. The XOR gates 522 and 526 include outputs 524 and 528, respectively. Of course, other examples exist for the phase detection logic 532 (e.g., the supplemental circuit 530 and phase detection logic 532 may be combined in a single circuit).

Figure 5B:
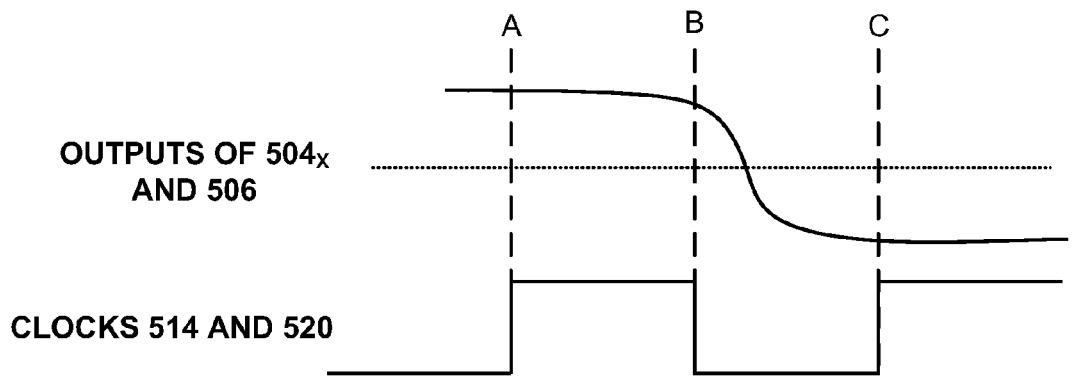
FIG. 5B is a timing diagram depicting the operation of the improved phase detector of FIG. 5A, according to an example.
Figure 5C:
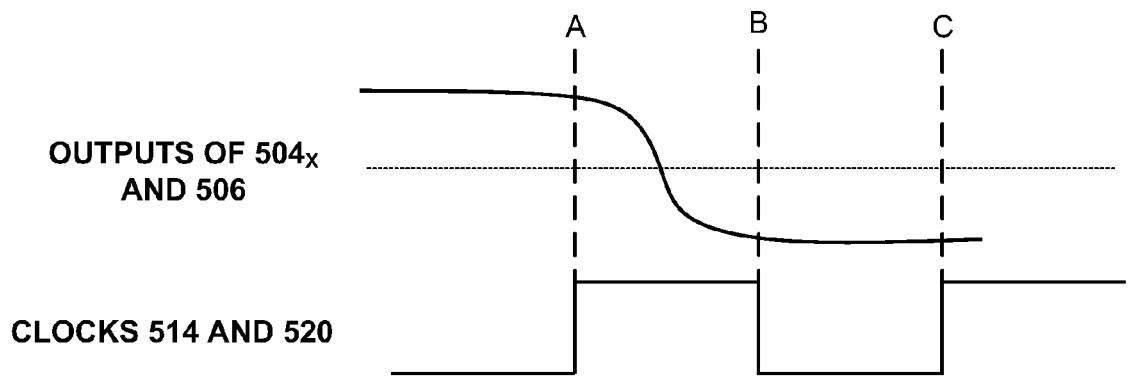
FIG. 5C is a timing diagram depicting an operation of the improved phase detector of FIG. 5A, according to another example.

To illustrate, FIGS. 5B and 5C are timing diagrams depicting the operation of the improved phase detector 500 when the clocks 514 and 510 are advanced in phase with respect to the signal transition and delayed in phase with respect to the signal transition, respectively. As shown in FIGS. 5B and 5C, on the first rising edge of the clocks 514 and 520 (i.e. first sampling instant), the buffer 510 stores a first comparison value generated by the comparator $504_X$. Next, on the falling edge of the clock signal 520 (i.e., third sampling instant), the buffer 516 stores a third comparison value generated by the comparator 506. Further, on the second rising edge of the clock signals 514 and 520 (i.e., second sampling instant), the buffer 510 stores a second comparison value generated by the comparator $504_X$, while the first comparison value is shifted to and stored in the buffer 512. At approximately the same time (i.e., at the second sampling instant), the third comparison value is shifted to and stored in the buffer 518.

Hence, the data samples held in buffers 512, 518, and 510 correspond to samples A, B, and C, respectively, as shown in FIGS. 5B and 5C. Similar to that above, these samples are then processed by the phase detection logic 532, and the phase detection logic 532 (or improved phase detector 500, more generally) provides an indication of the phase relationship between the analog signal 502 and clock 514 and/or clock 520.

Figure 9A:
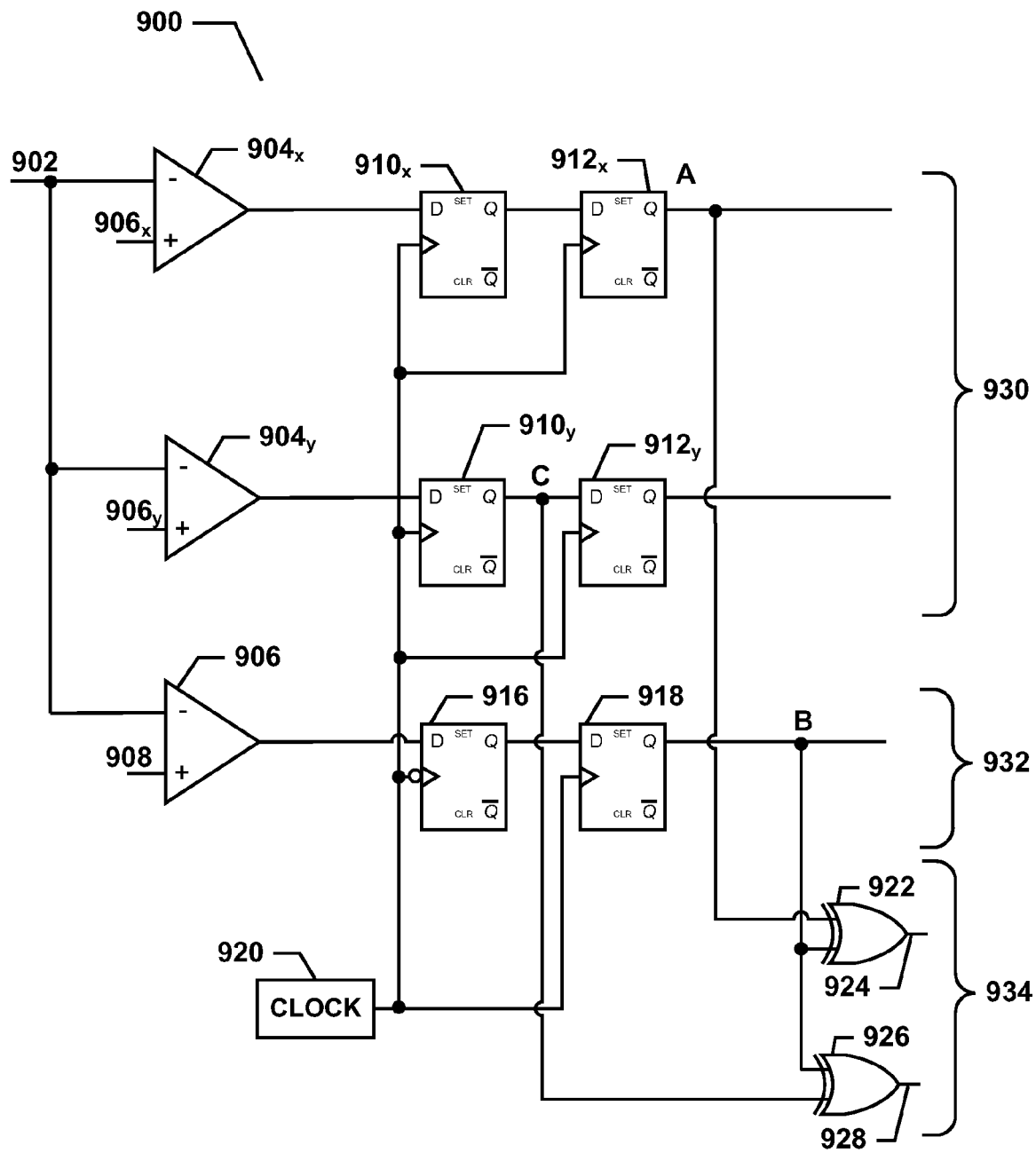
FIG. 9A shows an example of a circuit diagram of another embodiment of a phase detector.

FIG. 9A is a circuit diagram of another embodiment of an improved phase detector 900 utilizing ADC components, according to an example. The improved phase detector 900 includes ADC 930, supplemental circuit 932, and phase detection logic 934. The improved phase detector 900 may operate substantially similar to the improved phase detector 300.

For example, similar to that above, the improved phase detector 900 includes from the ADC 930 the comparator $904_x$, and buffers $910_x$ and $912_x$. The comparator $904_x$ receives as inputs the analog signal 902 and a threshold voltage $906_x$ and outputs a plurality of comparison values to the buffer $910_x$, which in turn outputs to buffer $912_x$. Buffers $910_x$ and $912_x$ also receive as input a clock signal from clock 920. In this embodiment, the improved phase detector 900 may further include from the ADC 930 the comparator $904_y$ and buffers $910_y$ and $912_y$. The comparator $904_y$ receives as inputs the analog signal 902 and a threshold voltage $906_y$ and outputs a plurality of comparison values to the buffer $910_y$, which in turn outputs to buffer $912_y$. Buffers $910_y$ and $912_y$ also receive as input a clock signal from clock 920.

In this embodiment, the improved phase detector 900 may further include the supplemental circuit 932. The supplemental circuit 932 may include comparator 906, which receives as inputs the analog signal 902 and a threshold voltage 908. The supplemental circuit 930 may further include buffers 916 and 918, which receive as inputs clock signals from the clock 920 which may be part of either the ADC 930 or supplemental circuit 932. The buffer 916 is connected to the output of the comparator 506, and the buffer 518 is connected to the output of the buffer 516. Of course, the supplemental circuit 530 may take other arrangements as well. For example, the output of the ADC comparator $504_X$ may be connected to each of the buffers $910_x$, $910_y$, and 916, or the output of the ADC comparator $504_y$ may be connected to each of the buffers $910_x$, $910_y$, and 916.

In this embodiment, rather than taking the first, second, and third samples from the output of one comparator, the first, second, and third samples are taken from the outputs of three different comparators $904_x$, $904_y$, and 906, respectively. According to an example, the threshold voltages $906_x$, $906_y$, and 908 may be equal to one another. According to another example the threshold voltages $906_x$, $906_y$, and 908 may be different from one another. According to yet another example, the threshold voltage $904_x$ may be equal to the threshold voltage $904_y$. According to yet another example, the threshold voltage $904_x$ may be equal to the threshold voltage 906. According to yet another example, the threshold voltage $904_y$ may be equal to the threshold voltage 906.

Similar to the improved phase detector 300, in the improved phase detector 900, the buffers $910_x$, $912_x$, $910_y$, $912_y$, 916, and 918 cooperatively produce first, second, and third samples, with the third sampling instant being between the first and second sampling instants. Preferably the third sampling instant is substantially at a midpoint between the first and second sampling instants Similar to the improved phase detector 300, the improved phase detector 900 includes phase detection logic 934. The phase detection logic 934 operates substantially similar to the phase detection logic 318. As shown, the phase detection logic 934 includes XOR gates 922 and 926. The output A of buffer 912x and output B of buffer 918 are connected to XOR gate 922, and the output C of buffer 910y and output B of buffer 918 are connected to the XOR gate 926. The XOR gates 922 and 926 include outputs 924 and 928, respectively. Of course, other examples exist for the phase detection logic 932 (e.g., the supplemental circuit 932 and phase detection logic 934 may be combined in a single circuit).

Figure 9B:
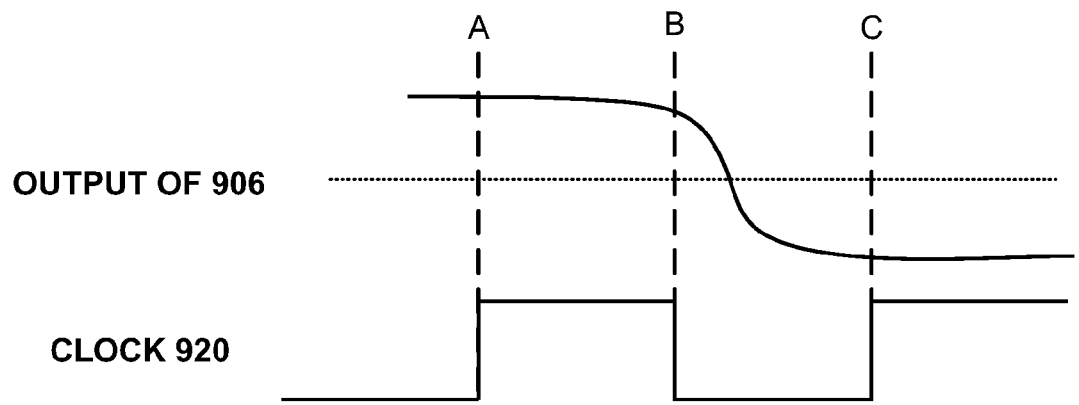
FIG. 9B is a timing diagram depicting an operation of the improved phase detector of FIG. 9A, according to an example.
Figure 9C:
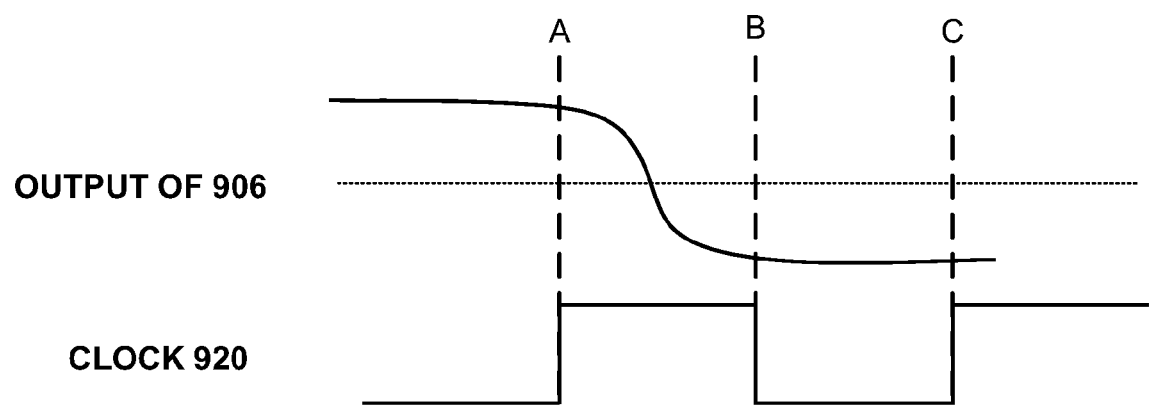
FIG. 9C is a timing diagram depicting an operation of the improved phase detector of FIG. 9A, according to another example.

To illustrate, FIGS. 9B and 9C are timing diagrams depicting the operation of the improved phase detector 900 when the clock 920 is advanced in phase with respect to the signal transition and delayed in phase with respect to the signal transition, respectively. As shown in FIGS. 9B and 9C, on the first rising edge of the clocks 920 (i.e. first sampling instant), the buffers $910_x$ stores a first comparison value generated by the comparator $904_x$. Next, on the falling edge of the clock signal 920 (i.e., third sampling instant), the buffer 916 stores a third comparison value generated by the comparator 906. Further, on the second rising edge of the clock signal 920 (i.e., second sampling instant), the buffer $910_y$ stores a second comparison value generated by the comparator $904_y$, while the first comparison value is shifted to and stored in the buffer $912_x$. At approximately the same time (i.e., at the second sampling instant), the third comparison value is shifted to and stored in the buffer 918.

Hence, the data samples held in buffers $912_x$, 918, and $910_y$ correspond to samples A, B, and C, respectively, as shown in FIGS. 9B and 9C. Similar to that above, these samples are then processed by the phase detection logic 932, and the phase detection logic 932 (or improved phase detector 900, more generally) provides an indication of the phase relationship between the analog signal 902 and clock 920.

Figure 6:
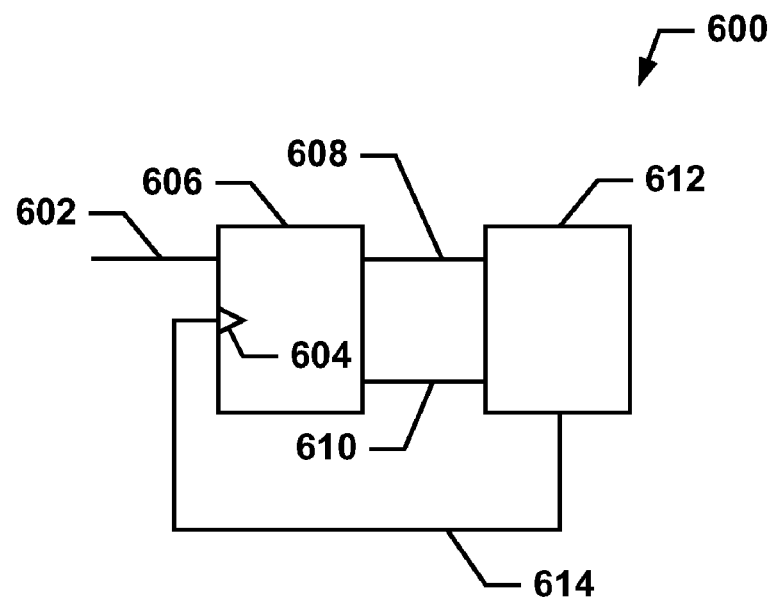
FIG. 6 is a block diagram of an embodiment of a phase-correction system, according to an example.

Once an improved phase detector detects that the sampling clock is out of phase with an analog signal (e.g., the sampling clock is either too fast or too slow), phase-correction circuitry may be used to accordingly retard or advance the sampling clock. FIG. 6 is a block diagram of an embodiment of a phase-correction system 600, according to an example. The phase-correction system 600 includes an improved phase detector 606 and a phase-correction circuit 612.

The improved phase detector 606 may be substantially similar to the improved phase detector 300, for example. As shown in FIG. 6, the improved phase detector 604 receives as inputs an analog signal 602 and a phase-correction signal from the phase-correction circuit 612, and provides an output to the phase-correction circuit 612 on lines 608 and 610. As noted, the improved phase detector 606 provides an indication as to the phase relationship between the analog signal 602 and the sampling clock, such as whether the sampling clock is advanced or delayed in phase with respect to the signal transition of signal 602. To illustrate, if line 608 is high and the line 610 is low, this may indicate that the sampling clock is delayed, and thus needs to be advanced. On the other hand, if the line 608 is low and the line 610 is high, then this may indicate that the clock 604 is too fast, and thus needs to be retarded. Further, if the lines 608 and 610 are both low, then this may indicate that no phase correction should occur.

The phase-correction circuit 612 receives as inputs lines 608 and 610, and provides an output 614 that is input to the improved phase detector 606. Upon receiving an indication of the phase relationship between the analog signal 602 and the sampling clock via lines 608 and 610, the phase-correction circuit 612 may accordingly retard or advance the sampling clock (e.g., the phase-correction circuit 612 may advance the sampling clock when the third sampling instant is after the transition point, and retard the sampling clock when the third sampling instant is before the transition point).

Figure 7:
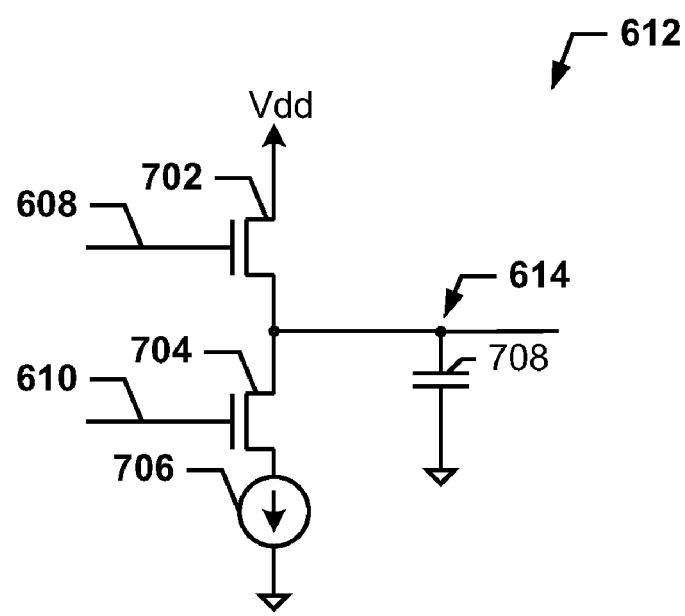
FIG. 7 is a circuit diagram of an embodiment of a phase-correction circuit, according to an example.

The phase-correction circuit 612 may take any of a variety of configurations. FIG. 7 is a circuit diagram of the phase-correction circuit 612, according to an example. As shown, the phase-correction circuit 612 includes transistors 702 and 704 (e.g., nMOS devices), current source 706, and capacitor 708. In operation, when the lines 608 and 620 are both low (thus indicating a voltage transition has not occurred between the first and second sampling instants), both the transistors 702 and 704 are turned off, and the voltage at node 614 remains unchanged. But when the line 608 is high and the line 610 is low (indicating the clock is slow, and thus needs to be advanced), the transistor 702 is turned on and the transistor 704 is turned off. When the transistor 702 is turned on, the capacitor 708 is coupled to Vdd, and the charge on capacitor 708 is incrementally increased, thus increasing the voltage at node 614. The increased voltage at node 614 is fed to the sampling clock of the improved phase detector circuit 606, perhaps slightly increasing the speed of the sampling clock.

On the other hand, when the line 608 is low and the line 610 is high (indicating the clock is fast, and thus needs to be retarded), the transistor 702 is turned off and the transistor 704 is turned on. When the transistor 704 is on, the current source 706 drains current from the node 614, thus slightly discharging the capacitor 708 and incrementally decreasing the voltage at node 614. The decreased voltage at node 614 is fed to the sampling clock of the improved phase detector circuit 606, perhaps slightly decreasing the speed of the sampling clock. In such a manner, the speed of the sampling clock may be continually incrementally increased and decreased accordingly such that the phase difference between the sampling and signal transitions is substantially minimized.

Figure 8:
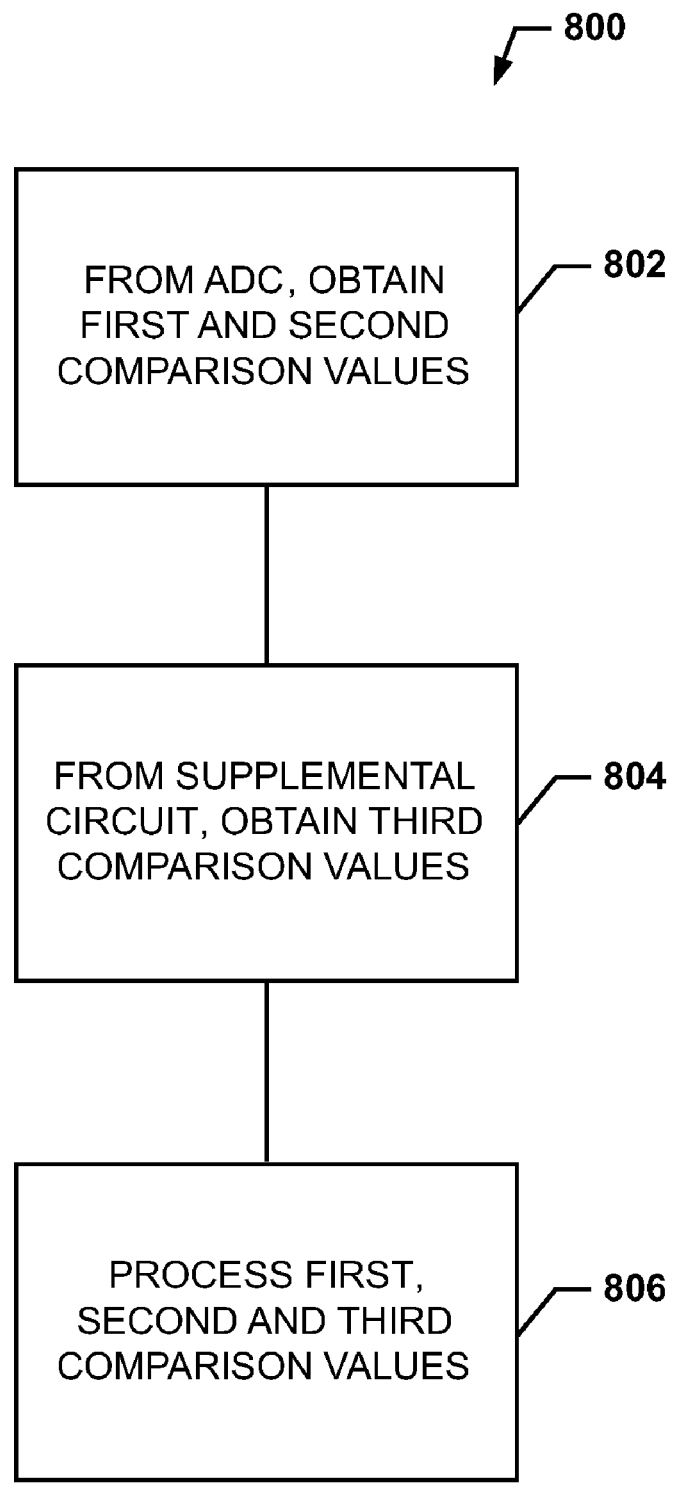
FIG. 8 is a flow chart of a method, according to an example.

FIG. 8 is a flow chart of a method 800, according to an example. As shown in FIG. 8, at block 802, the method includes, from an ADC having a sampling clock signal that determines sampling instants, obtaining a first comparison value between an analog signal and a first threshold voltage at a first sampling instant, and obtaining a second comparison value between the analog signal and a second threshold voltage at a second sampling instant. At block 804, the method includes, from a supplemental circuit, obtaining a third comparison value between the analog signal and a third threshold voltage at a third sampling instant between the first and second sampling instants. At block 806, the method includes processing the first, second, and third comparison values to determine a phase relationship between the analog signal and the sampling clock.

As noted, at block 802, the method includes—from an ADC having a sampling clock signal that determines sampling instants—obtaining the first comparison value between the analog signal and the first threshold voltage at the first sampling instant, and obtaining the second comparison value between the analog signal and the second threshold voltage at the second sampling instant. The ADC may include a plurality of comparators that each generates comparison values by comparing the analog signal to a respective threshold voltage. Preferably, the first and second comparison values are generated by a given comparator in the ADC. In other embodiments, the first and second comparison values are generated by two different comparators (each with respective threshold voltages).

The respective threshold voltages corresponding to the plurality of comparators may cooperatively define a voltage range. The first, second, and third threshold voltages may each approximately be a middle amplitude in the voltage range. Put another way, the analog signal may include a transition point, which is the time at which the analog signal crosses an approximately middle amplitude between a high and low amplitude, and the first, second, and third threshold voltages may each approximately be equal to the middle amplitude.

The ADC may also include a plurality of buffers. A first buffer in the plurality of buffers receives as inputs the output of the given comparator and a clock signal from the sampling clock. A second buffer in the plurality of buffers receives as inputs the output of the first buffer and a clock signal from the sampling clock. Preferably, the clock signals to the first and second buffers are at the same rate and in phase with one another. In one embodiment, the first and second comparison values are obtained from the second and first buffers, respectively. In another embodiment, rather than the ADC, the supplemental circuit includes the first and second buffers.

In operation, at a first sampling instant determined by the sampling clock, the first buffer stores a comparison value (i.e., first comparison value) generated by the given comparator at approximately that sampling instant. At the next sampling instant (i.e., second sampling instant) determined by the sampling clock, the first buffer stores another comparison value (i.e., second comparison value) generated by the given comparator at approximately that sampling instant, while the first comparison value is shifted to and stored in the second buffer.

At block 804, the method includes, from a supplemental circuit, obtaining a third comparison value between the analog signal and a third threshold voltage at a third sampling instant between the first and second sampling instants. The supplemental circuit may include a supplemental comparator, and third and fourth buffers. As noted above, the supplemental circuit may further include the first and second buffers.

The supplemental comparator generates a plurality of comparison values by comparing the analog signal to the third threshold voltage. The third threshold voltage may be equal to the middle amplitude between a high and a low amplitude in the analog signal (the middle amplitude may correspond to the transition point in the analog signal). In some examples, the first, second, and third threshold voltages are equal to one another. In other examples, either the first and third threshold voltages are equal to each other, or the second and third threshold voltages are equal to each other.

The third buffer receives as inputs the output of the supplemental comparator and a clock signal from the sampling clock. Alternatively, the third buffer may receive a clock signal from a supplemental clock, and the clock signal from the supplemental clock to the third buffer is preferably at the same rate as and in phase with the clock signals provided by the sampling clock to the first and second buffers.

The fourth buffer receives as inputs the output of the third buffer and a clock signal from the sampling clock, for instance. The clock signal from the sampling clock to the fourth buffer is preferably in phase with the clock signals provided to the first and second buffers. In the case where a supplemental clock provides the clock signals to the fourth buffer, the clock signals from the supplemental clock are preferably at the same rate as and in phase with the clock signals provided to the first and second buffers.

In operation, at an intermediate sampling instant (third sampling instant) between the first and second sampling instants, the third buffer stores a comparison value (e.g., third comparison value) generated by the supplemental comparator at approximately that intermediate sampling instant. Preferably, the third sampling instant is at a midpoint between the first and second sampling instants. At the second sampling instant, the third comparison value is shifted from the third buffer and stored in the fourth buffer. Thus, in one full clock cycle of the sampling clock, the first, second, and third comparison values generated at the first, second, and third sampling instants, respectively, are stored at the outputs of the second, fourth, and first buffers, respectively.

At block 806, the method includes processing the first, second, and third comparison values to determine a phase relationship between the analog signal and the sampling clock (and/or supplemental clock, if used). In some embodiments, phase detection logic (e.g., phase detection logic 318) processes the first, second, and third comparison values. Processing the comparison values may include providing the first, second, and third comparison values to first and second XOR gates. The outputs of the second and fourth buffers may be connected to the first XOR gate, and the outputs of the first and fourth buffers may be connected to the second XOR gate. The first and second XOR gates outputs may cooperatively provide an indication as to the phase relationship between the analog signal and the sampling clock (e.g., whether the sampling clock is faster or slower than twice the rate of the analog signal).

Processing the first, second, and third comparison values may include verifying that the first and second comparison values indicate a voltage transition. To illustrate, if the outputs of the first and second buffers are both the same, then the outputs of the first and second XOR gates are both equal to zero, thus indicating a voltage transition in the analog signal 302 has not occurred between the first and second sampling instants. On the other hand, the presence of either a falling edge (from high to low) or a rising edge (from low to high) between the first and second sampling instants in the analog signal will result in different outputs for the first and second buffers, thus indicating a voltage transition has occurred between the first and second sampling instants.

Processing the first, second, and third comparison values may include determining whether the third sampling instant is before or after the transition point (the time at which the analog signal crosses an approximate middle amplitude between a high and low amplitude). To illustrate, if the outputs of the first and second buffers are not the same, and if the output of the second and fourth buffers are equal, then the third sampling instant is before the transition point, thus indicating that the sampling clock is too fast. In the case where the clock 308 is too fast, the output of the first XOR gate is low and the output of the second XOR gate is high. And if the outputs of the first and fourth buffers are equal, then the third sampling instant is after the transition point, thus indicating that the sampling clock is too slow. In the case where the sampling clock is too slow, the output of the first XOR gate is high and the output of the second XOR gate is low. Thus, the first and second XOR gates cooperatively provide an indication of the phase relationship between the analog signal and sampling clock (e.g. whether the sampling clock is faster or slower than twice the rate of the analog signal 206, and/or whether the third sampling instant is before or after the transition point of the analog signal).

Processing the comparison values may further include advancing the sampling clock when the third sampling instant is after the transition point, and retarding the sampling clock when the third sampling instant is before the transition point. This may be performed by any of a variety of circuits and/or devices, such as phase-correction circuitry 612.

Embodiments of the invention have been described above. Those skilled in the art will appreciate that changes may be made to the embodiments described without departing from the true spirit and scope of the invention as defined by the claims.

We claim:

1. A method comprising:
from an analog-to-digital converter having a sampling clock signal that determines sampling instants, obtaining a first comparison value between an analog signal and a first threshold voltage at a first sampling instant, and obtaining a second comparison value between the analog signal and a second threshold voltage at a second sampling instant;
from a supplemental circuit, obtaining a third comparison value between the analog signal and a third threshold voltage at a third sampling instant between the first and second sampling instants; and
processing the first, second, and third comparison values to determine a phase relationship between the analog signal and the sampling clock;
wherein processing the first, second, and third comparison values comprises verifying that the first and second comparison values indicate a voltage transition.

2. The method of claim 1, wherein the first, second, and third threshold voltages are equal to one another.

3. The method of claim 1, wherein the first and third threshold voltages are equal to each other, or the second and third threshold voltages are equal to each other, or the first and second threshold voltages are equal to each other.

4. The method of claim 1, wherein the first, second, and third threshold voltages are different from one another.

5. The method of claim 1, wherein the analog-to-digital converter comprises a plurality of comparators that each compares an analog signal to a respective threshold voltage, wherein the respective threshold voltages corresponding to the plurality of comparators cooperatively define a voltage range, and wherein the first, second, and third threshold voltages are each approximately at a middle amplitude in the voltage range.

6. The method of claim 1, wherein a transition point is the time at which the analog signal crosses the third threshold voltage, and wherein processing the first, second, and third comparison values further comprises determining whether the third sampling instant is before or after the transition point.

7. The method of claim 6, further comprising:
advancing the sampling clock when the third sampling instant is after the transition point; and
retarding the sampling clock when the third sampling instant is before the transition point.

8. The method of claim 1, wherein the third sampling instant is at a midpoint between the first and second sampling instants.

9. The method of claim 1, wherein processing the first, second, and third comparison values comprises providing the first, second, and third comparison values to first and second XOR gates.

10. The method of claim 1, wherein the analog-to-digital converter comprises a plurality of buffers, and wherein obtaining the first and second comparison values comprises obtaining the first and second comparison values from first and second buffers of the plurality of buffers.

11. The method of claim 1, wherein the analog-to-digital converter comprises a plurality of comparators, and wherein obtaining the first and second comparison values comprises obtaining the first and second comparison values from comparison values generated by one of the comparators of the plurality of comparators.

12. A system comprising:
an analog-to-digital converter having (i) a sampling clock to determine sampling instants, and (ii) a plurality of comparators, wherein a given comparator in the plurality of comparators generates a first plurality of comparison values by comparing the analog signal to a first and second threshold voltages;
a second buffer connected to the given comparator, wherein the second buffer stores a second comparison value generated by the given comparator at a second sampling instant;
a first buffer connected to the second buffer, wherein the first buffer stores a first comparison value generated by the given comparator at a first sampling instant;

a supplemental comparator that generates a second plurality of comparison values by comparing the analog signal to a third threshold voltage;

a supplemental buffer connected to the supplemental comparator, wherein the supplemental buffer stores a third comparison value generated by the supplemental comparator at a third sampling instant between the first and second sampling instants; and phase detection logic that processes the first, second, and third comparison values to determine a phase relationship between the analog signal and sampling clock.

13. The system of claim 12, wherein the analog-to-digital converter includes at least one of the first and second buffers.

14. The system of claim 12, wherein the first, second, and third threshold voltages are equal to one another.

15. The method of claim 12, wherein the first and third threshold voltages are equal to each other, or the second and third threshold voltages are equal to each other, or the first and second threshold voltages are equal to each other.

16. The method of claim 12, wherein the first, second, and third threshold voltages are different from one another.

17. The system of claim 12, wherein the third sampling instant is at a midpoint between the first and second sampling instants.

18. The system of claim 12, wherein the analog-to-digital converter is a flash analog-to-digital converter that generates a thermometer code having a plurality of bit slots, wherein the first comparison value is a first bit from a given bit slot at the first sampling instant, and wherein the second comparison value is a second bit from the said bit slot at the second sampling instant.

19. The system of claim 12, further comprising a supplemental sample clock coupled to the supplemental buffer.

20. The system of claim 12, wherein each of the plurality of comparators compares the analog signal to a respective threshold voltage, wherein the respective threshold voltages corresponding to the plurality of comparators cooperatively define a voltage range, and wherein the first and second threshold voltages are each approximately at a middle voltage in the voltage range.

21. The system of claim 12, wherein the phase detection logic comprises first and second XOR gates.

22. The system of claim 12, wherein a transition point is the time at which the analog signal crosses the third threshold voltage, wherein the phase detection logic is configured to
verify that the first and second comparison values indicate a voltage transition; and
determine whether the third sampling instant is before or after the transition point.

23. The system of claim 22, further comprising phase-correction circuitry configured to:
advance the sampling clock when the third sampling instant is after the transition point; and
retard the sampling clock when the third sampling instant is before the transition point.

* * * * *